United States Patent
Chen et al.

(10) Patent No.: US 8,421,491 B2
(45) Date of Patent: Apr. 16, 2013

(54) ACTIVE NON-CONTACT PROBE CARD

(75) Inventors: Ming-Kun Chen, Yanchao Township, Kaohsiung County (TW); Yi-Lung Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 400 days.

(21) Appl. No.: 12/723,415

(22) Filed: Mar. 12, 2010

(65) Prior Publication Data

US 2011/0050262 A1    Mar. 3, 2011

(30) Foreign Application Priority Data

Sep. 1, 2009 (TW) .............................. 98129457 A (51) Int. Cl.
*G01R 31/00* (2006.01)
*G01R 31/20* (2006.01)

(52) U.S. Cl.
USPC ............. 324/754.21; 324/754.01; 324/754.09

(58) Field of Classification Search ............... None
See application file for complete search history.

(56) References Cited

U.S. PATENT DOCUMENTS

| | | | |
|---|---|---|---|
| 5,233,291 A * | 8/1993 | Kouno et al. | 324/750.17 |
| 6,150,832 A * | 11/2000 | Mazur et al. | 324/754.28 |
| 6,677,771 B2 * | 1/2004 | Zhou et al. | 324/750.25 |
| 7,106,082 B2 * | 9/2006 | Yoshioka | 324/750.22 |
| 2005/0127898 A1 * | 6/2005 | Yoshioka | 324/158.1 |
| 2007/0126435 A1 | 6/2007 | Eldridge et al. | |
| 2007/0148795 A1 * | 6/2007 | Kitajima | 438/14 |
| 2009/0202807 A1 | 8/2009 | Takeyama et al. | |

FOREIGN PATENT DOCUMENTS

| | | |
|---|---|---|
| CN | 101398441 | 4/2009 |
| CN | 101506671 | 8/2009 |
| JP | 62058650 A * | 3/1987 |
| JP | 2009085720 | 4/2009 |
| WO | WO-2007/148795 A1 | 12/2007 |

* cited by examiner

*Primary Examiner* — Jermele M Hollington
(74) *Attorney, Agent, or Firm* — Muncy, Geissler, Olds & Lowe, PLLC (57) ABSTRACT

Provided is an active non-contact probe card including a carrier, a support base, a piezoelectric material layer, an active sensor array chip and a control circuit. The support base is disposed on the carrier. The piezoelectric material layer is connected with the support base. The position of the active sensor array chip with respect to the carrier is determined according to the thicknesses of the support base and the thicknesses of the piezoelectric material layer. A control circuit provides a control voltage to the piezoelectric material layer to control the thickness of the piezoelectric material layer, so as to adjust the position of the active sensor array chip with respect to the carrier.

19 Claims, 6 Drawing Sheets

ACTIVE NON-CONTACT PROBE CARD

This application claims the benefit of Taiwan application Serial No. 98129457, filed Sep. 1, 2009, the subject matter of which is incorporated herein by reference.

TECHNICAL FIELD

The invention relates in general to a probe card, and more particularly to an active non-contact probe card.

BACKGROUND

Along with the rapid advance in semiconductor technology, the integrated circuit (IC) is miniaturized, the function is diversified and the processing speed and the operation frequency are higher. To achieve these, the number of the IC input/output (I/O) pins must be increased so as to meet the requirements of multi-functional signal processing. Thus, the layout of the I/O pins is directed towards high density matrix distribution and the signal transmission are by non-contact capacitance coupling, so as to reduce the circuit size and increase the processing speed.

Non-contact probe card is used for testing in wafer-level test. However, when a non-contact probe card is used for testing a wafer, the distance between the probe card and the wafer must be properly controlled, so as to form a signal transmission path between the electrode of the probe card and the corresponding electrode of the wafer by capacitance coupling. In convention, the distance between the probe card and the wafer is controlled by a motor. However, as the distance between the probe card and the wafer is very small, it is very difficult to precisely control the distance between the probe card and the wafer by the motor and the precision control on the capacitance coupling is not easily achieved. Moreover, in convention, the probe card may collide and damage the wafer.

Thus, how to maintain the precise signal transmission in non-contact test and avoid damage to the IC on the wafer has become an imminent challenge.

BRIEF SUMMARY

Example of the invention is directed to an active non-contact probe card, which adjusts the position of the active sensor array chip of the probe card by controlling the thickness of the piezoelectric material layer so as to precisely control the distance between the active sensor array chip and a device under test, hence further avoiding the probe card colliding or damaging the device under test when the probe card is aligned to the device under test.

According to a first example of the present invention, an active non-contact probe card including a carrier, a support base, a piezoelectric material layer, an active sensor array chip, and a control circuit is provided. The support base is disposed on the carrier. The piezoelectric material layer is connected with the support base. The position of the active sensor array chip with respect to the carrier is determined according to the thicknesses of the support base and the thicknesses of the piezoelectric material layer. The control circuit provides a control voltage to the piezoelectric material layer to control the thickness of the piezoelectric material layer, so as to adjust the position of the active sensor array chip with respect to the carrier.

According to a second example of the present invention, a testing method for active non-contact probe card is provided. The testing meted includes the following steps. An active non-contact probe card is provided, wherein the active non-contact probe card has a carrier, a support base, a piezoelectric material layer and an active sensor array chip. The support base is disposed on the carrier, the piezoelectric material layer is connected with the support base and the position of the active sensor array chip with respect to the carrier is determined according to the thicknesses of the support base and the thicknesses of the piezoelectric material layer. A device under test is aligned to the active sensor array chip; and a distance between the device under test and the active sensor array chip is measured. A control voltage is provided to the piezoelectric material layer according to the distance to control the relative thickness of the piezoelectric material layer, so as to adjust the position of the active sensor array chip with respect to the carrier and to change the distance between the device under test and the active sensor array chip.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE INVENTION

One of examples of the invention provides an active non-contact probe card including a carrier, a support base, a piezoelectric material layer, an active sensor array chip and a control circuit. The support base is disposed on the carrier. The piezoelectric material layer is connected with the support base. The position of the active sensor array chip with respect to the carrier is determined according to the thicknesses of the support base and the thicknesses of the piezoelectric material layer. The control circuit provides a control voltage to the piezoelectric material layer to control the thickness of the piezoelectric material layer, so as to adjust the position of the active sensor array chip with respect to the carrier. Several embodiments of the invention are disclosed below.

First Embodiment

Figure 1:
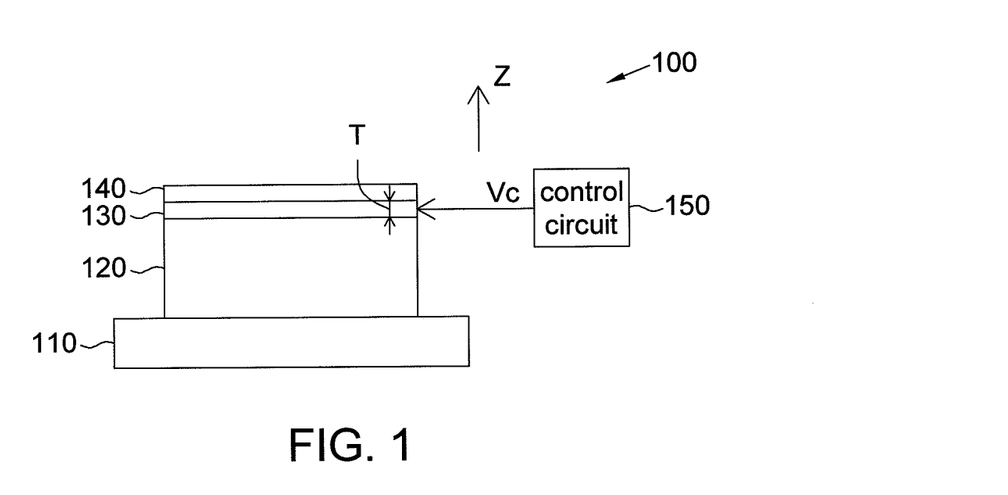
FIG. 1 shows a structural diagram of an active non-contact probe card according to a first embodiment of the invention.

Referring to FIG. 1, a structural diagram of an active non-contact probe card according to a first embodiment of the invention is shown. The probe card 100 includes a carrier 110, a support base 120, a piezoelectric material layer 130, an active sensor array chip 140 and a control circuit 150. The support base 120 is disposed on the carrier 110. The piezoelectric material layer 130 is disposed between the support base 120 and the active sensor array chip 140. The active sensor array chip 140 is disposed on the piezoelectric material layer 130. The control circuit 150 provides a control voltage Vc to the piezoelectric material layer 130 to control the thickness T of the piezoelectric material layer 130, so as to adjust the position of the active sensor array chip 140 with respect to the carrier 110.

The piezoelectric material layer 130 is made from piezoelectric material, which is at least one of single crystal, polymer, thin film, ceramics, and composite material or any combination thereof. When the control circuit 150 changes the control voltage Vc, the thickness T of the piezoelectric material layer 130 is precisely adjusted at the micro meter (μm) level or the sub-micro meter (sub-μm) level, so as to precisely control the position of the active sensor array chip 140 with respect to the carrier 110. That is, the height of the active sensor array chip 140 at the Z-axis is precisely adjusted, so as to maintain an appropriate distance between the active sensor array chip 140 and a device under test DUT (not illustrated in FIG. 1). Thus, the present embodiment of the invention improves the precision in controlling the distance between the active sensor array chip 140 and the device under test DUT.

Figure 2:
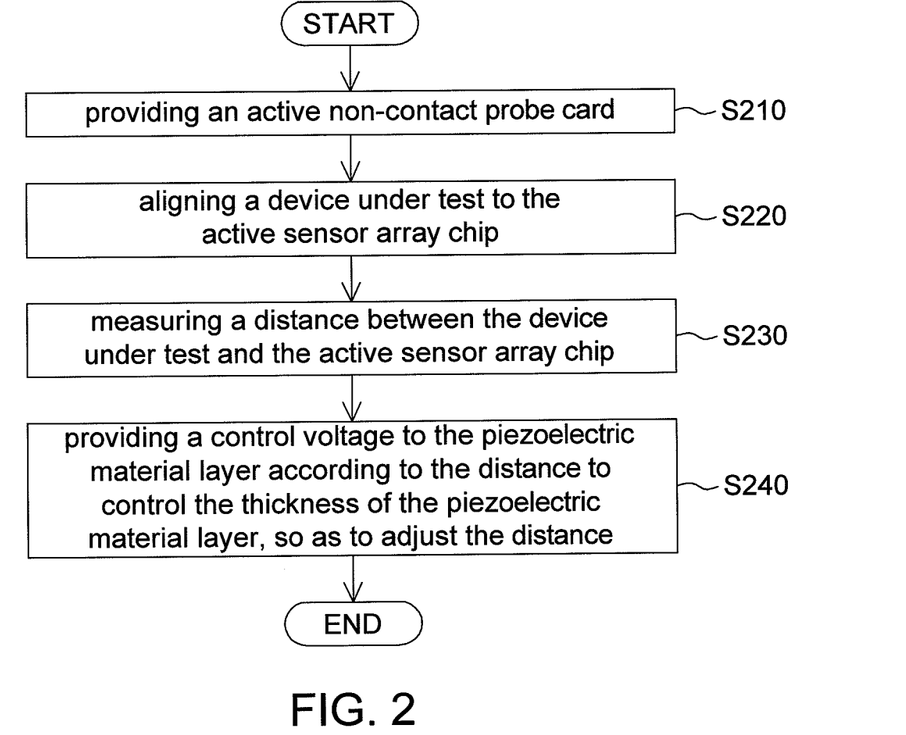
FIG. 2 shows a flowchart of a testing method for the active non-contact probe card according to the first embodiment of the invention.

Referring to FIG. 2, a flowchart of a testing method for the active non-contact probe card according to the first embodiment of the invention is shown. The testing method is applicable but not limited to the probe card 100 of FIG. 1. The method includes the following steps. At step S210, an active non-contact probe card, such as the probe card 100, is provided. At step S220, a device under test DUT is aligned to the active sensor array chip 140. At step S230, a distance d between the device under test DUT and the active sensor array chip 140 is measured. At step S240, a control voltage Vc is provided to the piezoelectric material layer 130 according to the distance d, to control the thickness T of the piezoelectric material layer 130. The control voltage Vc is provided by the control circuit 150 for example. Thus, the testing method can change the distance d between the device under test DUT and the active sensor array chip 140 by adjusting the position of the active sensor array chip 140 with respect to the carrier 110.

During the testing process, when the active sensor array chip 140 of the probe card 100 is aligned to the device under test DUT, a signal transmission path is formed between the active sensor array chip 140 and the device under test DUT due to capacitor coupling. The probe card 100 tests the device under test DUT by outputting or receiving at least one signal via the signal transmission path. As the distance between the probe card and the device under test is precisely adjusted, the signal on the signal transmission path is stably transmitted, further increasing the test precision of the probe card and avoiding the probe card colliding and damaging the device under test.

Figure 3:
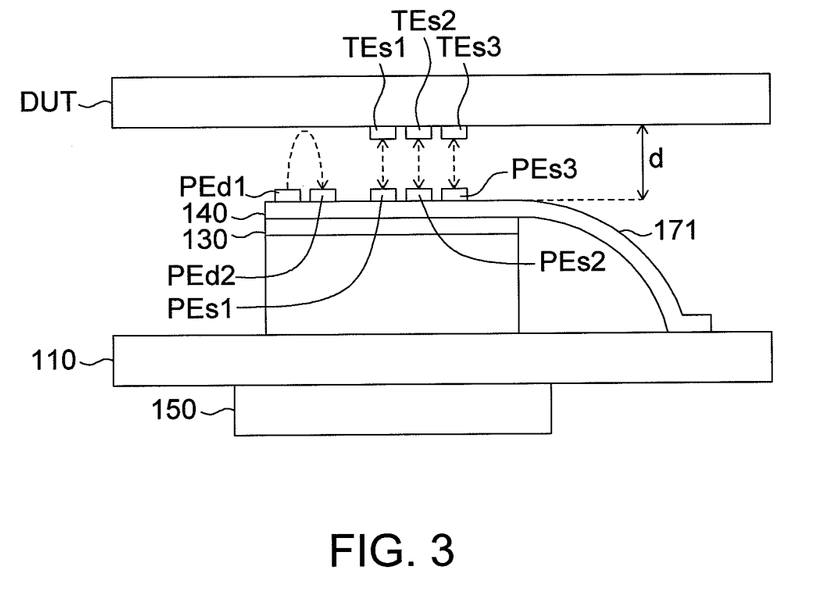
FIG. 3 shows an example of the alignment between the active non-contact probe card of FIG. 1 and a device under test.

Referring to FIG. 3, an example of the alignment between the active non-contact probe card of FIG. 1 and a device under test is shown. The device under test DUT is a die or a wafer for example. In the present example, the device under test DUT has at least one target electrode, such as the target electrodes TEs1~TEs3. The active sensor array chip 140 has at least one probe electrode, such as the probe electrodes PEs1~PEs3, for transmitting signals. When at least one probe electrode of the active sensor array chip 140 is aligned to at least one target electrode of the device under test DUT, the active sensor array chip 140 can output to or receive at least one signal from the device under test DUT via at least one corresponding target electrode and at least one probe electrode. The signal outputted or received via the probe electrodes PEs1~PEs3 and the target electrodes TEs1~TEs3 are digital test signals.

Figure 4:
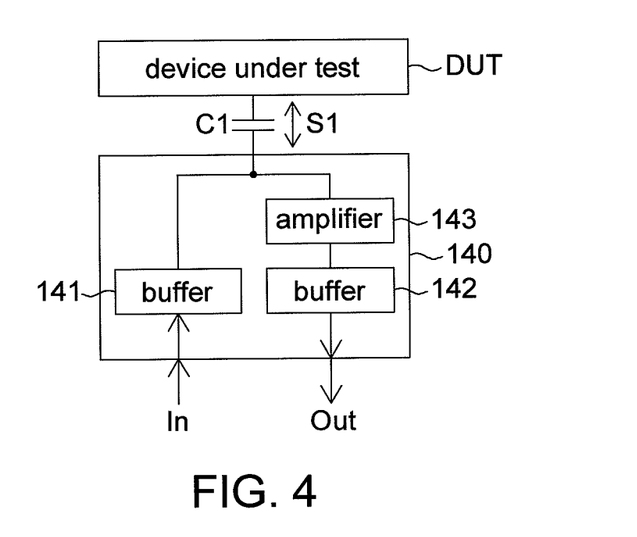
FIG. 4 shows an example of the internal circuit of an active sensor array chip in the active non-contact probe card and a signal transmission path between the active sensor array chip and a device under test.

The transmission of signals is exemplified by the probe electrode PEs1 and the target electrode TEs1. Referring to FIGS. 3 and 4. FIG. 4 shows an example of the internal circuit of the active sensor array chip and a signal transmission path between the active sensor array chip 140 and the device under test. After the active non-contact probe card 100 is aligned to the device under test DUT, the probe electrode PEs1 is aligned (or opposite) to the corresponding target electrode TEs1. Meanwhile, the probe electrode PEs1 and the target electrode TEs1 can be equivalent to a capacitor C1 of FIG. 4. The active sensor array chip 140 can transmit to or receive a signal S1 from the device under test DUT via the capacitor C1. For example, the signal S1 can be inputted to the buffer 141 from the input end In, and the active sensor array chip 140 can transmit the signal S1 to the device under test DUT via the capacitor C1. Or, the signal S1 can be outputted from the device under test DUT, and the active sensor array chip 140 can receive the signal S1 via the capacitor C1 and output the signal S1 from the output end Out via the amplifier 143 and the buffer 142.

Thus, the capacitor C1 formed by the electrodes PEs1 and TEs1 can be used as a signal transmission path, such as a high-frequency signal transmission path, between the active sensor array chip 140 and the device under test DUT. The impedance of the capacitor C1 is related to the distance d between the probe card 100 and the device under test DUT. For the probe card 100 to effectively transmit signals via the capacitor C1, the present embodiment of the invention maintains the distance d within an appropriate and precise range so as to stabilize the signal transmission path.

Referring to FIG. 3, the active sensor array chip 140 further has two adjacent probe electrodes PEd1~PEd2 for sensing distance. As the capacitance value corresponding to the probe electrodes PEd1~PEd2 is related to the distance d, the present embodiment of the invention can measure the distance d according to the capacitance value corresponding to the two probe electrodes PEd1~PEd2. After that, in the present embodiment of the invention, the control circuit 150 can control the thickness of the piezoelectric material layer 130 so as to adjust the distance d between the active sensor array chip 140 and the device under test DUT.

Further, the control circuit 150 can generate the control voltage Vc to the piezoelectric material layer 130 according to the capacitance value corresponding to the two probe electrodes PEd1~PEd2, to control the thickness T of the piezoelectric material layer 130. Thus, when the capacitance value corresponding to the probe electrode PEd1~PEd2 is too small, this implies that the distance d is too far and the control circuit 150 will generate the control voltage Vc to increase the thickness T of the piezoelectric material layer 130 to reduce the distance d. Likewise, when the capacitance value corresponding to the probe electrode PEd1~PEd2 is too large, this implies that the distance d is too close, and the control circuit 150 will generate the control voltage Vc to decrease the thickness T of the piezoelectric material layer 130 to prolong the distance d. Thus, the appropriate distance d between the probe card 100 and the device under test DUT is maintained, hence avoiding the active sensor array chip 140 colliding or damaging the device under test DUT. Furthermore, if the equivalent capacitance value between the probe electrode and the corresponding target electrode is large enough, the corresponding impedance will be small to facilitate the transmission of signals.

Figure 5:
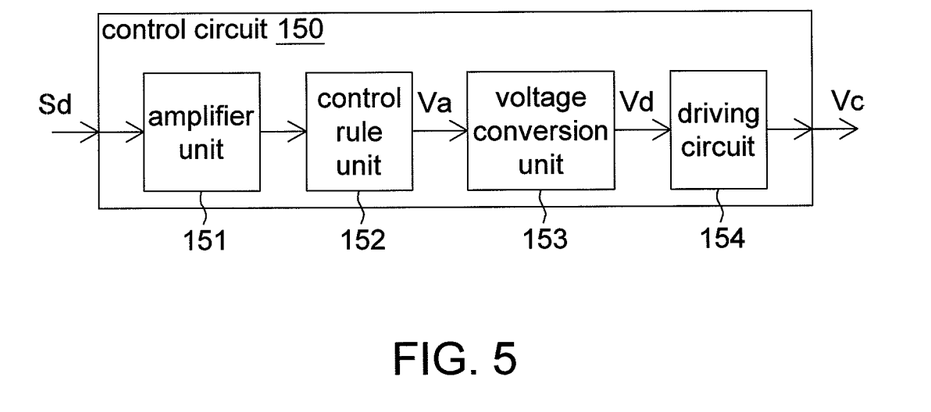
FIG. 5 shows an example of a block diagram of the control circuit.

The generation of the control voltage Vc by the control circuit 150 is disclosed below. Referring to FIG. 5, a block diagram of the control circuit 150 is shown. The control circuit 150 receives a signal Sd converted from the capacitance value of the probe electrodes PEd1~PEd2, wherein the signal Sd is related to the distance d. The signal Sd is amplified by an amplifier unit 151 first and then is further converted into a corresponding voltage adjustment value Va by a control rule unit 152. The control rule unit 152 generates the voltage adjustment value Va according to the hysteresis of the piezoelectric material layer 130 (that is, the relation between deformation and voltage of the piezoelectric material layer 130). A voltage conversion unit 153 generates a converted voltage Vd, such as a direct current voltage, according to the voltage adjustment value Va. A driving circuit 154 generates the control voltage Vc to the piezoelectric material layer 130 according to the converted voltage Vd.

In the example illustrated in FIG. 3, the active sensor array chip 140 is electrically connected to the carrier 110 via a wafer bar 171 and the carrier 110 is a circuit board for example. The wafer bar 171 and the active sensor array chip 140 are integrally formed in one piece for example. The wafer bar 171 and the active sensor array chip 140 are disposed on the same wafer for example. The wafer bar 171 is obtained by thinning a wafer, wherein the thinned wafer has slight flexibility. By such, the active sensor array chip 140 substantially maintains horizontal level, and the position of the wafer bar 171 is not higher than the top surface of the probe electrode of the active sensor array chip 140, hence avoiding the wafer bar 171 colliding or damaging the device under test.

Figure 6:
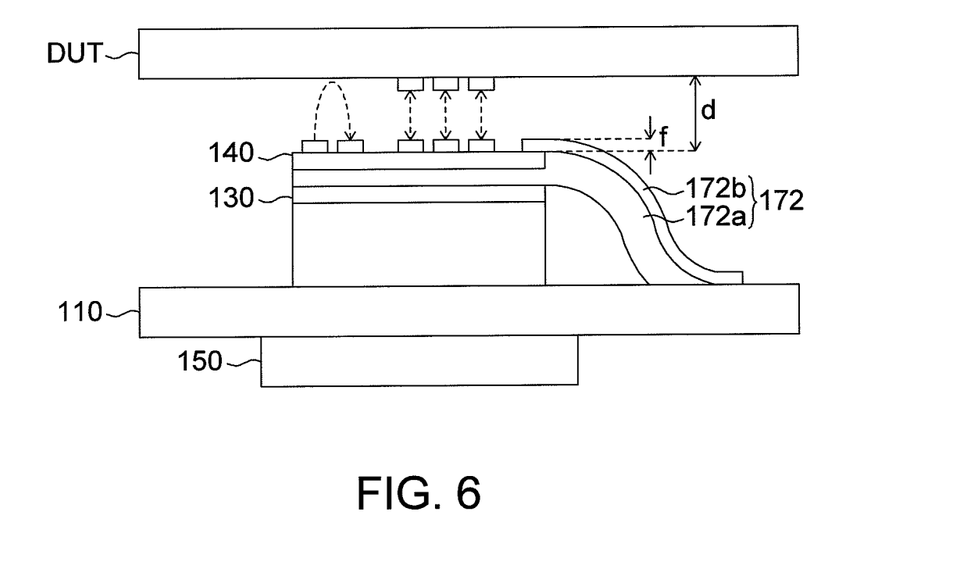
FIG. 6 shows another example of the alignment between the active non-contact probe card of FIG. 1 and a device under test.

Referring to FIG. 6, another example of the alignment between the active non-contact probe card of FIG. 1 and the device under test is shown. The example of FIG. 6 differs with the example of FIG. 3 in that the active sensor array chip 140 of FIG. 6 is electrically connected to the carrier 110 via a thin film 172. The thin film 172 includes a base 172a and a metal layer 172b. The active sensor array chip 140 is disposed on the base 172a and electrically connected to the carrier 110 via the metal layer 172b. In practice, the thickness f of the metal layer 172b of the thin film 172 can be as smaller as possible but does not affect the operation of the active sensor array chip 140. The metal layer 172b of the thin film 172 is disposed on the active sensor array chip 140 for example, but the present embodiment of the invention is not limited thereto. For example, if the distance d is μm level, then the thickness f of the metal layer 172b of the thin film 172 can be designed as sub-μm level, wherein the thickness f is smaller than distance d to avoid the thin film 172 colliding or damaging the device under test. Furthermore, in the present example, by replacing wafer bar 171 with the thin film 172, the manufacturing cost is further reduced.

In an exemplary example, the distance d between the device under test DUT and the active sensor array chip 140 is smaller than 15 μm. The thickness of the piezoelectric material layer is about 10000 μm. If the wafer bar 171 is used, then the thickness of the wafer bar 171 is smaller than 50 μm. Or, if the thin film 172 is used, then the thickness of the base 172a is about 100 μm, and the thickness f of the metal layer 172b is about 0.5 μm. The values exemplified above are for elaborating but not for limiting the invention.

In the first embodiment, the position of the active sensor array chip of the probe card is adjusted by controlling the thickness of the piezoelectric material layer, so as to precisely control the distance between the active sensor array chip and the device under test. Thus, when the probe card is aligned to the device under test, the probe card neither collides nor damages the device under test.

Second Embodiment

Figure 7:
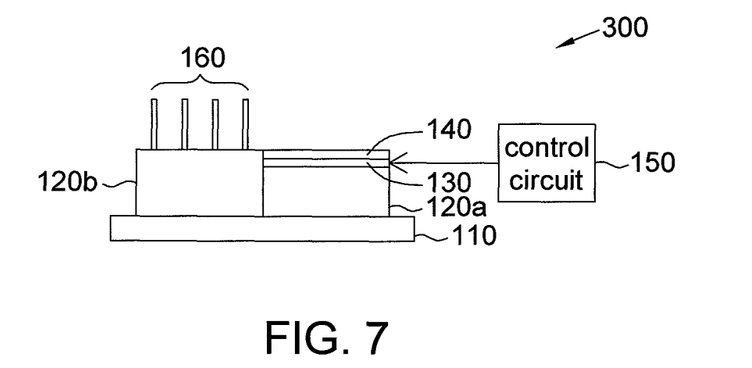
FIG. 7 shows a structural diagram of an active non-contact probe card according to a second embodiment of the invention.

Referring to FIG. 7, a structural diagram of an active non-contact probe card according to a second embodiment of the invention is shown. The present embodiment differs with the first embodiment in that the support base 120 can be divided into two parts, the support bases 120a and 120b. The probe card 300 of the present embodiment of the invention further includes at least one contact probe 160 disposed on the support base 120b, wherein the probe card 300 provides power to the device under test DUT via the contact probe 160. Like the first embodiment, when the probe card 300 is aligned to the device under test DUT, a signal transmission path is formed between the active sensor array chip 140 and the device under test DUT, so that the probe card 300 can transmit or receive at least one signal to test the function of the device under test DUT by way of capacitor coupling.

Figure 8:
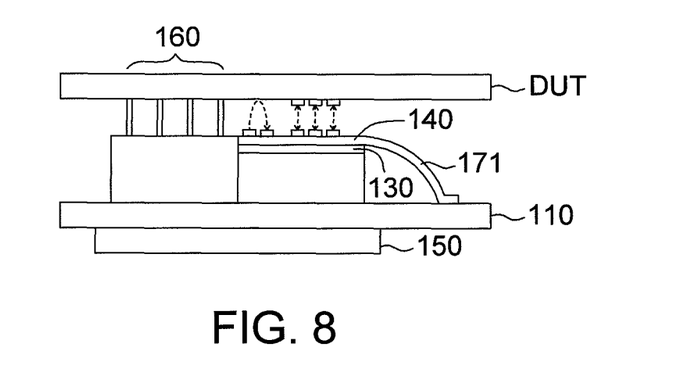
FIGS. 8 and 9 show examples of the alignment between the active non-contact probe card of FIG. 7 and the device under test.
Figure 9:
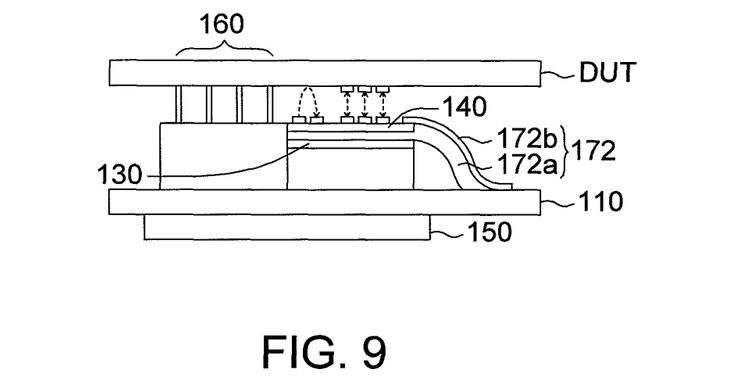

Referring to FIGS. 8 and 9, an example of the alignment between the active non-contact probe card of FIG. 7 and a device under test is shown. In the examples illustrated in FIGS. 8 and 9, the active sensor array chip 140 is electrically connected to the carrier 110 via the wafer bar 171 or the thin film 172.

In practical application, the contact probe 160 is gradually worn out along with the times of use, and the length of the contact probe 160 will even be shortened. Under such circumstance, the present embodiment of the invention compensates the distance between the active sensor array chip 140 and the device under test DUT by controlling the thickness T of the piezoelectric material layer 130. In other words, when the shortened contact probe 160 contacts the device under test DUT (which means the distance d between the active sensor array chip 140 and the device under test DUT is shorter), the present embodiment of the invention maintains the appropriate distance d between the active sensor array chip 140 and the device under test DUT by controlling the thickness T of the piezoelectric material layer 130. Thus, when the probe card is aligned to the device under test, the probe card will not collide or damage the device under test.

Third Embodiment

Figure 10A:
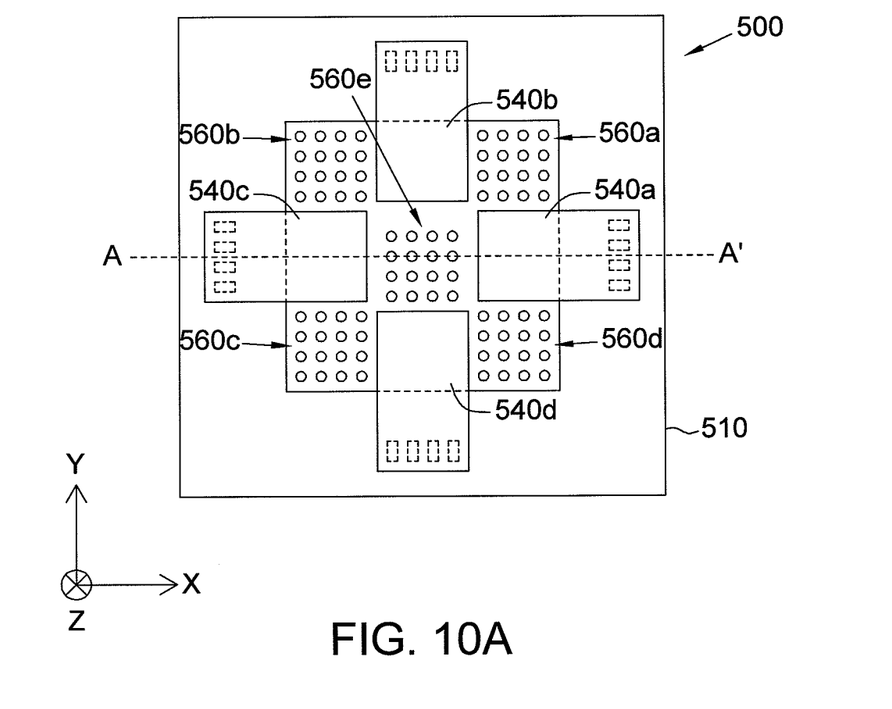
FIG. 10A shows a top view of an example of a probe card according to a third embodiment of the invention.
Figure 10B:
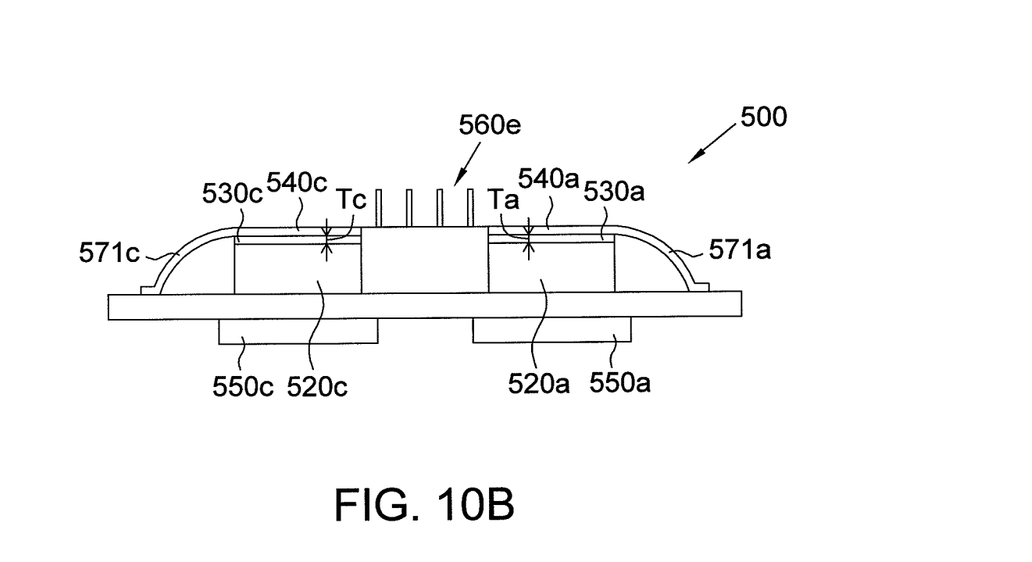
FIG. 10B shows a cross-sectional view along the line segment A-A' of FIG. 10A.

Referring to both FIGS. 10A and 10B. FIG. 10A shows a top view of an example of a probe card according to a third embodiment of the invention. FIG. 10B shows a cross-sectional view along the line segment A-A' of FIG. 10A. In the present embodiment, the probe card 500 has five contact probes 560a~560e, and four active sensor array chips 540a~540d for performing signal transmission/reception between the device under test. The present embodiment of the invention is exemplified by connecting the active sensor array chips 540a~540d to the carrier 510 via the wafer bars 571a~571d. However, the implementation of using thin film or other element for the connection between the active sensor array chips 540a~540d and the carrier 510 is adapted in the present embodiment of the invention.

Fourth Embodiment

Figure 11:
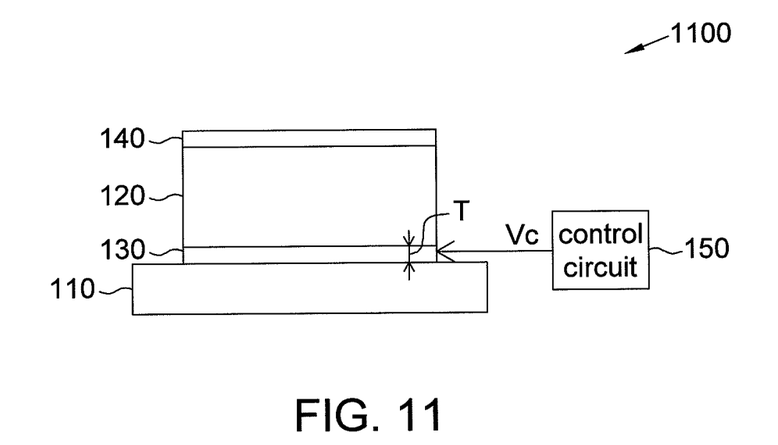
FIG. 11 shows a structural diagram of an active non-contact probe card according to a fourth embodiment of the invention.

Referring to FIG. 11, a structural diagram of an active non-contact probe card according to a fourth embodiment of the invention is shown. The present embodiment differs with the first embodiment in that the piezoelectric material layer

130 of the probe card 1100 is disposed between the support base 120 and the carrier 110, and the active sensor array chip 140 is disposed on the support base 120.

Like the first embodiment, the control circuit 150 provides a control voltage Vc to the piezoelectric material layer 130 to control the thickness T of the piezoelectric material layer 130, so as to adjust the position of the active sensor array chip 140 with respect to the carrier 110. Such implementation can be inferred from the above embodiments and is not repeated here.

Fifth Embodiment

Figure 12:
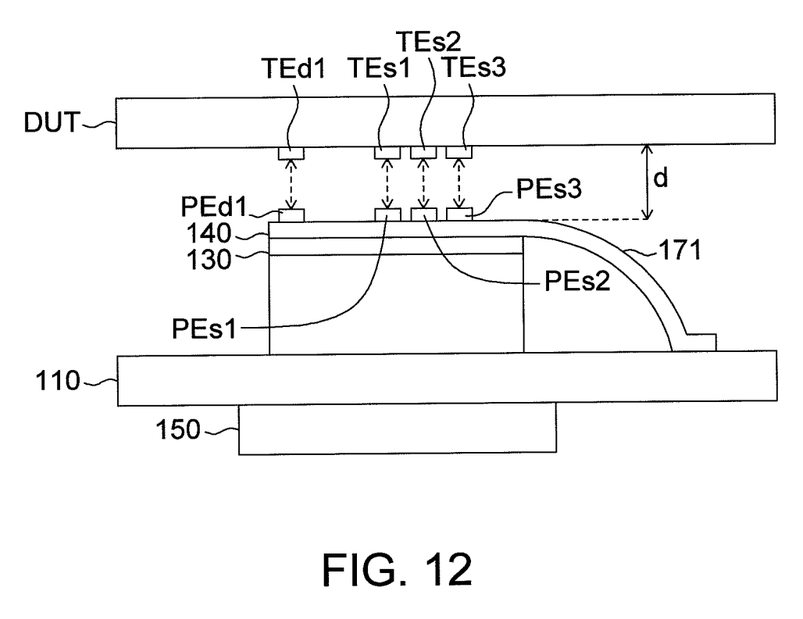
FIG. 12 shows another example of the alignment between the active non-contact probe card of FIG. 1 and a device under test according to a fifth embodiment of the invention.

Referring to FIG. 12, another example of the alignment between the active non-contact probe card of FIG. 1 and a device under test according to a fifth embodiment of the invention is shown. The present embodiment differs with the first embodiment in that the device under test DUT of the present embodiment at least has another target electrode, such as target electrode TEd1, for sensing the distance. As the capacitance value corresponding to the probe electrode PEd1 and the target electrode TEd1 (i.e. the capacitance value of the capacitor formed by the probe electrode PEd1 and the target electrode TEd1) is related to the distance d, the present embodiment of the invention obtains the measurement of the distance d according to the capacitance value corresponding to the probe electrode PEd1 and the target electrode TEd1.

When the probe electrode PEd1 is aligned to the target electrode TEd1, the control circuit 150 generates a control voltage Vc to the piezoelectric material layer 130 according to the capacitance value corresponding to the probe electrode PEd1 and the target electrode TEd1 to control the thickness T of the piezoelectric material layer 130. Such implementation can be inferred from the above embodiments and is not repeated here.

Many exemplary implementations of the probe card are disclosed in the above embodiments, but the invention is not limited thereto. The implementation of the active sensor array chip and the contact probe can be designed to fit actual needs. Moreover, the testing method illustrated in FIG. 2 is applicable to various probe cards illustrated in the above embodiments in addition to the probe card 100 of FIG. 1.

According to the active non-contact probe card disclosed in the above embodiments of the invention, the position of the active sensor array chip of the probe card is controlled by way of controlling the thickness of the piezoelectric material layer, so as to precisely control the distance between the active sensor array chip and the device under test, hence avoiding the probe card colliding or damaging the device under test when the probe card is aligned to the device under test. Thus, the probe card of the present embodiment of the invention further increases product yield rate and manufacturing reliability.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. An active non-contact probe card, comprising:
    a carrier;
    a support base disposed on the carrier;
    a piezoelectric material layer connected with the support base;
    an active sensor array chip, wherein a position of the active sensor array chip with respect to the carrier is determined according to a thicknesses of the support base and a thickness of the piezoelectric material layer; and
    a control circuit for providing a control voltage to the piezoelectric material layer to control the thickness of the piezoelectric material layer, so as to adjust the position of the active sensor array chip with respect to the carrier,
    wherein the active sensor array chip is electrically connected to the carrier via a thin film, and the thin film comprises a base and a metal layer, the active sensor array chip is disposed on the base and the active sensor array chip is electrically connected to the carrier via the metal layer.

2. The probe card according to claim 1, wherein the piezoelectric material layer is disposed between the support base and the active sensor array chip.

3. The probe card according to claim 1, wherein the piezoelectric material layer is disposed between the support base and the carrier.

4. The probe card according to claim 1, further comprising:
    at least one contact probe disposed on the support base.

5. The probe card according to claim 1, wherein the active sensor array chip is electrically connected to the carrier via a wafer bar.

6. The probe card according to claim 5, wherein the thickness of the wafer bar is substantially smaller than 50 μm.

7. The probe card according to claim 1, wherein the thickness of the base is substantially about 100 μm, and the thickness of the metal layer is substantially about 0.5 μm.

8. The probe card according to claim 1, wherein the active sensor array chip has at least one probe electrode, and when the at least one probe electrode is aligned to at least one target electrode of a corresponding device under test, the active sensor array chip transmits to or receives at least one signal from the device under test via the at least one corresponding target electrode and the at least one probe electrode.

9. The probe card according to claim 1, wherein the active sensor array chip has a plurality of probe electrodes, and the control circuit generates the control voltage to the piezoelectric material layer according to the capacitance value corresponding to two adjacent probe electrodes to control the thickness of the piezoelectric material layer.

10. The probe card according to claim 1, wherein the active sensor array chip has at least one probe electrode, and when the at least one probe electrode is aligned to at least one target electrode of a corresponding device under test, the control circuit generates the control voltage to the piezoelectric material layer according to the capacitance value corresponding to the at least one probe electrode and the at least one target electrode to control the thickness of the piezoelectric material layer.

11. The probe card according to claim 1, wherein the thickness of the piezoelectric material layer is substantially 10000 μm.

12. The probe card according to claim 1, wherein the piezoelectric material layer is made from a piezoelectric material, which, is at least one of single crystal, polymer, thin film, ceramics, and composite material or any combination thereof.

13. A testing method for an active non-contact probe card, comprising:
    providing an active non-contact probe card having a carrier, a support base, a piezoelectric material layer and an active sensor array chip, wherein the support base is disposed on the carrier, the piezoelectric material layer is connected with the support base and the position of the active sensor array chip with respect to the carrier is determined according to a thicknesses of the support base and a thicknesses of the piezoelectric material layer;

enabling a device under test to be aligned to the active sensor array chip;

measuring a distance between the device under test and the active sensor array chip; and providing a control voltage to the piezoelectric material layer according to the distance to control the thickness of the piezoelectric material layer, so as to adjust the position of the active sensor array chip with respect to the carrier and to change the distance, wherein the active sensor array chip is electrically connected to the carrier via a thin film, and the thin film comprises a base and a metal layer, the active sensor array chip is disposed on the base and the active sensor array chip is electrically connected to the carrier via the metal layer.

14. The probe card testing method according to claim 13, wherein the active sensor array chip has at least one probe electrode, the device under test has at least one target electrode, and the step of enabling the device under test to be aligned to the active sensor array chip comprises:

enabling the at least one target electrode to be aligned to the at least one probe electrode.

15. The probe card testing method according to claim 13, wherein the active non-contact probe card further has a wafer bar electrically connected the active sensor array chip to the carrier.

16. The probe card testing method according to claim 13, wherein the active non-contact probe card further has a thin film electrically connected the active sensor array chip to the carrier.

17. The probe card testing method according to claim 13, wherein the active sensor array chip has a plurality of probe electrodes, and in the measuring step, the distance is measured according to a capacitance value corresponding to two adjacent probe electrodes.

18. The probe card testing method according to claim 13, wherein the active sensor array chip has at least one probe electrode, and in the measuring step, the distance is measured according to a capacitance value corresponding to the at least one probe electrode and at least one target electrode of the device under test.

19. The probe card testing method according to claim 13, wherein the distance is substantially smaller than 15 μm.

* * * * *